United States Patent [19]
Hutson

[11] 3,792,320

[45] Feb. 12, 1974

[54] SEMICONDUCTOR SWITCH DEVICES HAVING IMPROVED SHORTED EMITTER CONFIGURATIONS

[76] Inventor: Jerald L. Hutson, 901 Newberry, Richardson, Tex. 75080

[22] Filed: May 22, 1972

[21] Appl. No.: 255,449

[52] U.S. Cl. .......................... 317/235 R, 317/235 AB
[51] Int. Cl. .......................... H01l 13/00
[58] Field of Search .......................... 317/235

[56] References Cited

UNITED STATES PATENTS

| | | | |
|---|---|---|---|
| 3,476,992 | 11/1969 | Chu | 317/235 |
| 3,696,273 | 10/1972 | Foster | 317/235 |
| 3,641,403 | 2/1972 | Nakata | 317/235 |
| 3,599,061 | 8/1971 | Kokosa | 317/235 |

*Primary Examiner*—John S. Heyman
*Assistant Examiner*—E. Wojciechowicz

[57] ABSTRACT

The specification discloses a semiconductor body including a plurality of semiconductor layers of one conductivity type interleaved with layers of the opposite conductivity type to form a plurality of P-N junctions. Electrodes are connected to ones of the semiconductor layers to form a semiconductor switching device. An array of closely spaced apart shorting columns of one conductivity type extend from an interior P-N junction through an outer semiconductor layer having the opposite conductivity type. The shorting columns are spaced apart over substantially the entire area of the outer semiconductor layer to enhance the commutating and static dv/dt of the device and to enable the device to be utilized for higher frequency applications and with higher inductive loads. The specification discloses the use of the shorting column arrays for asymmetrical regenerative switches and for symmetrical semiconductor switches such as the triac.

12 Claims, 5 Drawing Figures

SEMICONDUCTOR SWITCH DEVICES HAVING IMPROVED SHORTED EMITTER CONFIGURATIONS

FIELD OF THE INVENTION

This invention relates to multilayer semiconductor devices and more particularly relates to multilayer semiconductor switching devices having improved switching speed characteristics.

THE PRIOR ART

Semiconductor switches are currently widely utilized for a plurality of control applications. Such switches include asymmetrical regenerative devices such as the semiconductor controlled rectifier (SCR) having four regions of alternate electrical conductivity types to provide switching in a single direction. The construction and operation of such controlled rectifier devices is described in chapter I of the General Electric Controlled Rectifier Manual, 2nd Edition, Copyright 1961, by the General Electric Company; an article by Moll, Tanenbaum, Goldey and Holonyak in the "Proceedings of the IRE," September 1956, Vol. 44, pp. 1174–1182. Additionally, various improvements to the conventional controlled rectifier are disclosed and claimed in U.S. Pat. No. 3,475,666, issued Oct. 28, 1969, and in U.S. Pat. No. 3,524,114, issued Aug. 11, 1970, by the present applicant.

In addition, the device commonly termed the triac is widely used when symmetrical switching action is required. A typical triac device has five layers of alternating semiconductor conductivity type, four of the layers being used for switching or conducting during one half cycle of an AC voltage source, and three of these same layers and the fifth layer being used for conducting during the alternate half cycle of the voltage source. Descriptions of the construction and operation of various types of triac devices are found in U.S. Pat. No. 3,275,909, issued Sept. 27, 1966, to F. W. Gutzwiller; and U.S. Pat. No. 3,317,746, issued May 2, 1967, and U.S. Pat. No. 3,475,666, issued Oct. 28, 1969, to the present applicant.

Various techniques have been heretofore developed for improving the operating characteristics and parameters of conventional SCR and triac devices. For example, it has been previously known to provide a shorting path in each of the quadrants of an SCR in order to short the emitters of the device. Provision of these shorting paths has been found to improve the stability of the SCR at high temperatures and to provide controlled beta drops for the device. However, prior SCR and triac devices have not been completely satisfactory with respect to switching speeds, and the prior devices have thus often been limited in their use at higher frequencies and with relatively high inductive loads.

SUMMARY OF THE INVENTION

In accordance with the present invention, a semiconductor switching device is provided which utilizes a large number of closely spaced shorting paths through exterior semiconductor layers to thereby substantially improve the switching speed characteristics of the device.

In accordance with a more specific aspect of the present invention, a semiconductor switching device is provided which includes a body of semiconductor material having a plurality of layers of successively opposite conductivity types to form a plurality of P-N junctions therein. Electrodes are attached to selected ones of the semiconductor layers to enable the use of the body as a switching device. A plurality of closely spaced shorting columns of one conductivity type extend from an inner layer of the same conductivity type through an outer layer having the opposite conductivity type into contact with one of the electrodes. The columns are spaced apart over substantially the entire area of the outer layer to thereby substantially improve the switching speed of the device.

In further accordance with the invention, a semiconductor controlled rectifier device having asymmetrical switching operation includes a body of semiconductor material having four layers of first and second conductivity types interleaved with one another to form a plurality of P-N junctions therein. An electrode contacts the surface of one of the exterior layers of the body having a first conductivity type. A plurality of spaced apart discrete elongated areas of the second conductivity type extend through the exterior layer into contact with the electrode. The elongated areas are spaced over substantially the entire area of the exterior layer to provide improved switching operation of the device.

In accordance with yet another aspect of the invention, a semiconductor triac switching device having symmetrical switching operation includes a body of semiconductor material having at least five layers of first and second opposite conductivity types. Layers of the first conductivity type are interleaved with layers of the second conductivity type to form a plurality of P-N junctions, the two external layers of the body being of the first conductivity type. A first electrode is in low resistance ohmic contact with a surface of one of the external layers of the body. A second electrode is in contact with the surface of the second external layer of the body. A plurality of closely spaced apart columns of semiconductor material of the second conductivity type extend from intermediate layers through the external layers into contact with the electrodes. The columns are spaced apart over substantially the entire area of the external layers with the exception of a central portion and substantially improve the switching time characteristics of the device.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENTS

Figure 1:
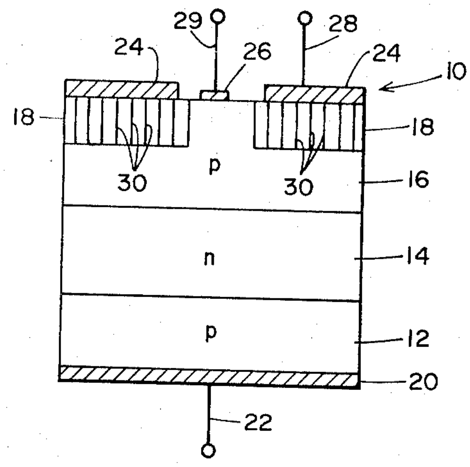
FIG. 1 is a diagrammatic side elevational view, in section, of an asymmetrical regenerative switch device according to the invention.
Figure 2:
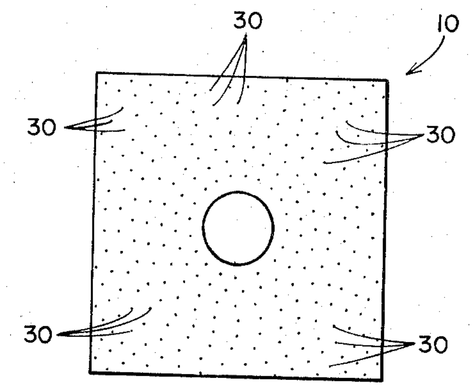
FIG. 2 is a top view of the device of FIG. 1 with the electrode metalization removed.

Referring to FIGS. 1 and 2, there is shown an asymmetrical regenerative switch embodying the invention. As shown in FIG. 1, the switch includes a body 10 of semiconductor material having a p-type conductivity layer 12 which is formed contiguous to an n-type conductivity layer 14 to form a rectifying P-N junction therewith. A second p-type layer 16 is formed contiguous to layer 14 and forms another rectifying P-N junction therewith. An exterior n-type electrical conductivity layer 18 is diffused into the layer 16. Layer 18 is formed in the well known configuration such that a central portion of the p-type layer 16 is exposed at the exterior surface of the body 10 to provide gate structure.

The semiconductor body 10 may be formed in any suitable manner known in the art. For example, an n-type electrical conductivity silicon wafer may be diffused on both sides to form the p-type layers 12 and 16. The n-type layer 18 may then be formed in layer 16 by conventional diffusion techniques using suitable dopants or impurities which are compatible with the particular semiconductor material being operated upon. The particular size and shapes of the diffused layers are determined by suitable masking and photographic techniques conventionally employed in semiconductor diffusion technology. Although it will be understood that any suitable semiconductor material may be utilized to form devices according to the invention, reference will be made to particular electrical conductivity types and to silicon as the material being utilized. Of course, it will be understood that the electrical conductivity types hereinafter specified may be interchanged.

An electrode 20, comprising any suitable metal or alloys such as nickel or the like, is bonded to the exterior surface of layer 12 and an electrical lead 22 is attached to electrode 20 in the conventional manner. Another metal electrode 24 is bonded to the top exterior surface of body 10 in contact with the n-type layer 18. An aperture is formed in the center region of the electrode 24 to expose the central surface of the p-type layer 16. This central region acts as the gate of the device and an electrode 26 is bonded thereto in the conventional manner. Electrical leads 28 and 29 are respectively bonded to electrodes 24 and 26 to form a three terminal asymmetrical semiconductor regenerative device.

Referring to FIG. 1, an array of closely spaced apart shorting columns 30 of p-type conductivity material is formed through layer 18. Each of the columns 30 extends from the lower junction of layers 16 and 18 and extends through the layer 18 into shorting contact with the electrode 24. FIG. 2 illustrates that the columns 30 extend over substantially the entire area of the n-type layer 18 and in the preferred embodiment of the invention are formed in concentric circles relative to the central gate region. The columns 30 act as a large number of small shorting paths through the n-type emitter of the device. It has been found that the provision of a large number of shorting columns 30 substantially increases the switching speed of an asymmetrical regenerative switching device. In addition, the provision of the shorting columns 30 further improves the stability of the device at high temperatures while giving controlled beta drops.

The shorting columns 30 may be formed through the n-type layer 18 by any conventional technique, such as the oxide masking technique. While the columns 30 are illustrated in FIGS. 1 and 2 as being circular in cross section, it will be understood that other cross sectional shapes could be utilized.

In the preferred embodiment, it has been found that an array of shorting columns having a diameter of approximately 2 mils and being spaced apart by approximately 10 mils from center to center has provided excellent operating characteristics to devices having exterior overall widths of 125–150 mils. Although variations in the spacing of the columns 30 may be utilized for various applications, it is generally desirable to space the columns in the range of 3–15 mils apart. The diameter of the columns may be varied for various applications, but a diameter of 2 mils has been found to work well and to be easily formed according to conventional resist techniques.

With the use of the present closely spaced array of shorting columns, it has been found in practice that the turn-off time of a conventional silicon controlled rectifier may be reduced, as an example, from 50 microseconds to 10 microseconds. In fact, the switching time characteristics of devices constructed in accordance with the present invention approach the characteristics of gold-doped devices.

The physical operation of the present array of densely spaced shorting columns is not completely understood, but the array appears to effectively lower the beta over the entire emitter structure in a uniform manner to provide a very rapid change in the beta curve of the device. As a result of the array of shorting columns, the improved semiconductor rectifier of the invention is provided with enhanced commutating and static dv/dt, and the device may be utilized for higher frequency applications and for higher inductive loads. In fact, with the use of the shorting column array of the invention, switching devices have been constructed which approach the switching speed of gold-doped devices.

Figure 3:
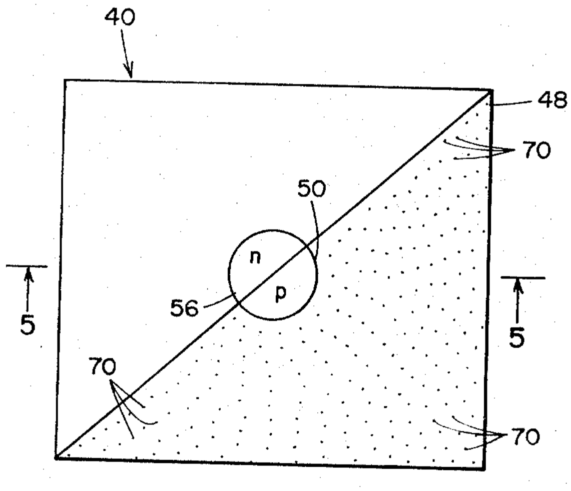
FIG. 3 is a top view, with the electrode metalization removed, of a symmetrical triac device embodying the invention.
Figure 4:
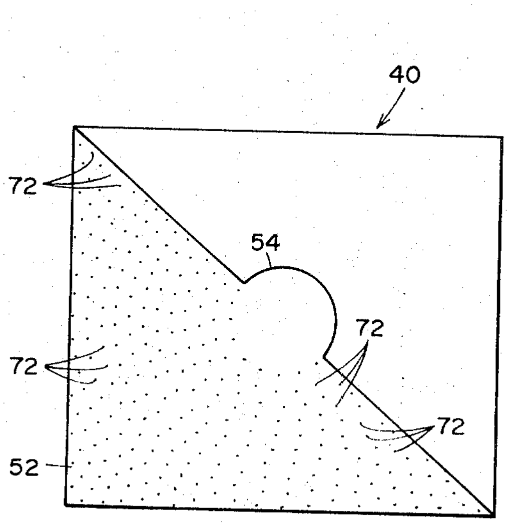
FIG. 4 is a bottom view, with the electrode metalization removed, of the device shown in FIG. 3.
Figure 5:
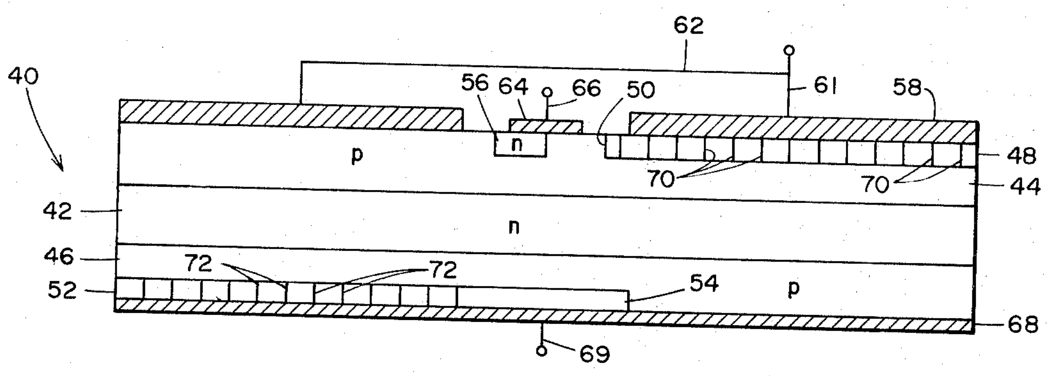
FIG. 5 is a side elevational sectional view taken generally along section lines 5—5 of the device shown in FIG. 3, with the electrode metalization being illustrated.

FIGS. 3–5 illustrate a symmetrical conducting device employing the concept of the invention.

Referring initially to FIG. 5, the device comprises a semiconductor body 40 having five layers of opposite semiconductor conductivity types being interleaved with one another to form a plurality of P-N junctions. The body 40 comprises a center layer or main base 42 of n-type material. Diffused regions 44 and 46 of p-type conductivity are formed on opposite sides of the layer 42. An external n-type layer 48 covering approximately one half the upper surface of the body is diffused into layer 44 and provides a planar upper surface of n and p-type conductivity material.

FIG. 3 illustrates a top view of the n-type layer 48 which has a generally triangular configuration, with the exception of an inwardly directed semicircular center portion defined by edge 50. In a somewhat similar manner, an external layer 52 of n-type material is diffused into the layer 46 to cover substantially one half the lower exterior surface of the body 40. FIG. 4 illustrates a bottom view of the body 40 and illustrates that the n-type layer 52 has a generally triangular shape, with the exception of a semicircular outwardly curved portion 54. The lower exterior surface of body 40 thus comprises a planar surface of n and p-type conductivity material. The layer 52 is disposed on the opposite half of body 40 from the layer 48.

A semicircular n-type region 56 is formed in the upper surface of the body 40 and is spaced apart from layer 48. It will be seen from FIG. 4 that the semicircular portion 54 of layer 52 is disposed directly below region 56. A metal electrode 58 is bonded to the upper surface of the body 40 in contact with the upper surface of the n-type layer 48. An electrode 60 is bonded to the exposed exterior surface of the p-type layer 44. Electrodes 58 and 60 are connected together by electrical leads 61 and 62 to provide one of the terminals of the device. An electrode 64 is bonded into contact with the n-type region 56 and extends into contact with layer 44. An electrical lead 66 is connected to electrode 64 to provide a second terminal of the device. A metal electrode 68 is bonded to the underside of the body 40 and includes an electrical lead 69 to provide a third terminal for the device.

Referring to FIG. 5, a large number of discrete shorting columns 70 are formed from p-type material and extend from the P-N junction between layers 44 and 48 through the layer 48 into contact with the electrode 58. As shown in FIG. 3, the array of columns 70 is provided over substantially the entire surface area of the n-type layer 48. The columns 70 may be formed by any suitable conventional technique such as by the oxide masking technique or the like. In addition, an array of shorting columns 72 is provided through the n-type layer 52. Shorting columns 72 are also comprised of p-type material and extend from the inner junction between layers 46 and 52 through the layer 52 into contact with the electrode 68. Thus, with the exception of the semicircular portion 54 and the region underlying the semicircular center portion of layer 48 defined by edge 50, substantially the entire area of layer 52 is shorted. It may be seen that the device includes an outer annular area having a relatively low gain due to the shorting column arrays and an inner cylindrical region having a relatively high gain due to the absence of the shorting columns.

As previously noted, the particular shape of the cross section of the shorting column 70 may be varied for various applications. Moreover, the spacing of the columns may be varied in accordance with various desired operating parameters. In the preferred embodiment, for a ten ampere triac device constructed on a wafer having sides in the range of 125 to 150 mils in width, circular cross sectional columns having a diameter of approximately 2 mils and spaced apart from center to center by intervals between 3 to 15 mils have been found to substantially increase the switching speed of the device.

The operation of the triac device shown in FIGS. 3–5 appears to be generally unchanged by the present shorting column arrays, except that the switching current of the device appears to be concentrated in the center high gain area of the device to make the central area act in a similar manner as a pilot switch to provide extremely fast switching. The concentration of switching current in the central area appears to be caused by the reduction of lateral currents through layers 48 and 52 as a result of the shorting column arrays.

It is thus apparent that the present invention provides an improved shorted emitter construction for use on both asymmetrical and symmetrical switching semiconductor devices. It will be understood that the several illustrated geometries of the invention may be changed and varied to achieve the desired effects, and that the particular constructions shown are not to be construed as limiting. Moreover, the various electrical conductivity types of the disclosed layers may be interchanged, as is well known.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A semiconductor switching device comprising:

a body of semiconductor material including a plurality of layers of successively opposite conductivity types to form a plurality of P-N junctions therein, electrodes attached to said body to provide an emitter and gate structure to enable use of said body as a switching device, and an array of closely spaced shorting columns of one conductivity type extending from an inner layer of said one conductivity through an outer layer having the opposite conductivity into contact with one of said electrodes, said shorting columns being of such diameter and spaced such that the centers of adjacent shorting columns are within the range of three-fifteen mils in order to effectively lower the beta over said emitter structure in a uniform manner to substantially increase the switching speed of said device.

2. The switching device of claim 1 wherein said device comprises an asymmetrical regenerative switch.

3. The switching device of claim 1 wherein said device comprises a symmetrical triac switch.

4. A semiconductor controlled rectifier device having asymmetrical switching operation comprising:

a body of semiconductor material having four layers of first and second conductivity types interleaved with one another to form a plurality of P-N junctions therein, an electrode contacting the surface of one of the exterior layers of said body having said first conductivity type to form emitter structure, a plurality of spaced apart discrete elongated areas of said second conductivity type extending through said exterior layer into contact with said electrode, said elongated areas being spaced over substantially the entire area of said exterior layer, and the centers of said elongated areas being spaced apart by a distance in the range of three-fifteen mils to effectively lower the beta over said emitter structure in a uniform manner, wherein the switching speed of said device is substantially increased.

5. The rectifier device of claim 4 wherein said elongated areas have generally circular cross sections.

6. The rectifier device of claim 5 wherein the diameters of said elongated areas are approximately two mils.

7. The rectifier device of claim 4 wherein said exterior layer has a central aperture through which a portion of an interior layer extends to form a gate for said device.

8. A semiconductor triac switching device having symmetrical switching operation comprising:

a body of semiconductor material having at least five layers of first and second opposite conductivity types, layers of said first conductivity type being interleaved with layers of said second conductivity type to form a plurality of P-N junctions, the two external layers of said body being of said first conductivity type, a first electrode in low resistance ohmic contact with the surface of one of said external layers of said body, a second electrode in contact with the surface of the second of said external layers, a plurality of closely spaced apart shorting columns of semiconductor material of said second conductivity type extending from intermediate layers thorugh each of said external layers into contact with said electrodes, the centers of said shorting columns being spaced apart by a distance in the range of three-fifteen mils in order that the switching current during the operation of said device is concentrated in the control region of said device and lateral currents through said external layers are reduced in order to substantially increase the switching speed of the triac switching device.

9. The triac switching device of claim 8 wherein said external layers are generally triangular in cross section, with the exception of semicircular central portions which are free of said shorting columns.

10 A semiconductor switching device comprising:

a body of semiconductor material including a plurality of layers of successively opposite conductivity types to form a plurality of P-N junctions therein, electrodes attached to said body to enable use of said body as a switching device, and an array of closely spaced shorting columns of one conductivity type extending from an inner layer of said one conductivity through an outer layer having the opposite conductivity into contact with one of said electrodes, said shorting columns having a generally circular cross section and spaced apart over substantially the entire area of said outer layer, the diameters of said shorting columns being approximately two mils and the distance between centers of adjacent zones of said shorting columns being ten mils or less, said columns substantially improving the switching speed of said device.

11. In a semiconductor switching device having a plurality of semiconductor material layers of one conductivity type interleaved with layers of the opposite conductivity type to form a plurality of P-N junctions and including electrodes connected to ones of said layers, the improvement comprising:

an array of closely spaced elongated columns of one conductivity type extending from an inner P-N junction through an outer semiconductor layer having the opposite conductivity type, the diameters of said shorting columns being approximately two mils and the distance between centers of adjacent columns being ten mils or less.

12. A semiconductor triac switching device having symmetrical switching operation comprising:

a body of semiconductor material having at least five layers of first and second opposite conductivity types, layers of said first conductivity type being interleaved with layers of said second conductivity type to form a plurality of P-N junctions, the two external layers of said body being of said first conductivity type, a first electrode in low resistance ohmic contact with the surface of one of said external layers of said body, a second electrode in contact with the surface of the second of said external layers, a plurality of closely spaced apart shorting columns of semiconductor material of said second conductivity type extending from intermediate layers through each of said external layers into contact with said electrodes, the diameters of said shorting columns being approximately two mils and the distance between centers of adjacent columns being ten mils or less, wherein the switching speed of the triac switching device is substantially increased.

* * * * *

PO-1050
(5/69)

UNITED STATES PATENT OFFICE
CERTIFICATE OF CORRECTION

Patent No. 3,792,320 Dated February 12, 1974

Inventor(s) Jearld L. Hutson

It is certified that error appears in the above-identified patent and that said Letters Patent are hereby corrected as shown below:

The name of the inventor is misspelled in the patent:
"Jerald" should be --Jearld--.

Signed and sealed this 29th day of October 1974.

(SEAL)
Attest:

McCOY M. GIBSON JR.
Attesting Officer

C. MARSHALL DANN
Commissioner of Patents